United States Patent
Zhou et al.

(10) Patent No.: US 8,354,341 B2
(45) Date of Patent: Jan. 15, 2013

(54) METHOD FOR FORMING AN INTERCONNECT STRUCTURE

(75) Inventors: Ming Zhou, Shanghai (CN); Yonggen He, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/208,332

(22) Filed: Aug. 11, 2011

(65) Prior Publication Data

US 2012/0264287 A1 Oct. 18, 2012

(30) Foreign Application Priority Data

Apr. 18, 2011 (CN) .......................... 2011 1 0097045

(51) Int. Cl.
*H01L 21/4763* (2006.01)

(52) U.S. Cl. ........ 438/622; 438/687; 438/654; 438/618; 438/784

(58) Field of Classification Search .............. 438/622, 438/687, 654, 618, 784, 485, 709, 798, 475
See application file for complete search history.

(56) References Cited

U.S. PATENT DOCUMENTS

| | | | | |
|---|---|---|---|---|
| 6,025,273 | A * | 2/2000 | Chen et al. | 438/706 |
| 6,472,231 | B1 * | 10/2002 | Gabriel et al. | 438/9 |
| 6,620,741 | B1 * | 9/2003 | Gracias et al. | 438/780 |
| 6,951,810 | B2 * | 10/2005 | Abell | 438/637 |
| 2002/0037627 | A1 * | 3/2002 | Liu et al. | 438/424 |
| 2003/0082924 | A1 * | 5/2003 | Andideh et al. | 438/778 |
| 2003/0186537 | A1 * | 10/2003 | Yamanaka et al. | 438/637 |
| 2007/0249179 | A1 * | 10/2007 | Lin et al. | 438/758 |
| 2008/0280457 | A1 * | 11/2008 | Ho et al. | 438/780 |
| 2011/0117678 | A1 * | 5/2011 | Varadarajan et al. | 438/4 |

FOREIGN PATENT DOCUMENTS

CN 101752298 A 6/2010

* cited by examiner

*Primary Examiner* — Jarrett Stark
*Assistant Examiner* — John M Parker
(74) *Attorney, Agent, or Firm* — Anova Law Group, PLLC

(57) ABSTRACT

A method for forming an interconnect structure includes providing a semiconductor substrate having a barrier layer, a low dielectric constant (Low K) inter-dielectric layer and a cap dielectric layer sequentially formed thereon; etching the cap dielectric layer and the Low K inter-dielectric layer sequentially until the barrier layer is exposed and a groove is formed; removing the cap dielectric layer until the Low K inter-dielectric layer is exposed; and doping a carbon element into the Low K inter-dielectric layer. The advantages of the method includes a decrease of the dielectric constant of the Low K inter-dielectric layer, thus, reduces the resistive-capacitive (RC) delay of interconnect layers of a semiconductor device and improve its operating speed and performance.

8 Claims, 4 Drawing Sheets

METHOD FOR FORMING AN INTERCONNECT STRUCTURE

CROSS-REFERENCES TO RELATED APPLICATIONS

This application claims priority under 35 USC §119 of Chinese Patent Application No. 201110097045.1, filed on Apr. 18, 2011, commonly assigned and incorporated herein by reference in its entirety.

BACKGROUND OF THE INVENTION

1. Field of the Invention

The present invention relates generally to semiconductor technology, and particularly to a method for forming an interconnect structure.

2. Description of Prior Art

The semiconductor manufacturing technology is a kind of planar manufacturing process. Large amounts of complex devices of various kinds are formed on a same substrate, and these devices are connected with each other so that they have complete electronic functions. During the manufacturing process, a large amount of grooves is formed on the substrate, so that a metal interconnect structure can be formed by filling a metal material into the grooves.

With the continuous demand for high level of integration and high-performance of very large scale integrated circuits, semiconductor technology is developing in a direction of smaller feature size, and the operation speed of chips is greatly affected by the resistance-capacitance (RC) delay caused by metal interconnects. To improve the performance of the integrated circuit, on one hand, Cu which has advantages such as low resistivity, high resistance to electromigration can replace Al as metal interconnects in the semiconductor to lower the resistance of metal interconnects.

On the other hand, the use of a low dielectric constant (Low K) inter-dielectric layer or a very Low K inter-dielectric layer as inter-metal dielectric (IMD) can effectively decrease the capacitance. Cu interconnect technology associated with IMD made of Low K materials is currently the most popular combination. It can effectively improve the resistive-capacitive effects, and certainly will become one of the standard interconnects technologies for next generation of semiconductor technology.

A schematic flow chart of a conventional method for forming an interconnect structure is shown in FIG. 1, which includes providing a semiconductor substrate having a dielectric layer formed thereon, the dielectric layer comprising a barrier layer, a Low K inter-dielectric layer, a cap layer and a hard mask layer sequentially formed thereon (S101); etching the dielectric layer on the semiconductor substrate to form a groove (S103); depositing Cu into the groove until Cu fills in the groove and covers the hard mask layer at both sides of the groove (S105); planarizing Cu and the dielectric layer by using chemical mechanical polishing technology until the Low K inter-dielectric layer is exposed (S107).

However, the RC delay of the interconnect structure formed by the conventional method is large so that a satisfactory performance of the semiconductor devices cannot be obtained.

BRIEF SUMMARY OF THE INVENTION

Embodiments of the present invention provide a method for forming an interconnect structure to solve the problem of large resistance-capacitance (RC) delay in the existing interconnect structure.

In an embodiment, a method for forming an interconnect structure includes:

providing a semiconductor substrate having a barrier layer, a low dielectric constant (Low K) inter-dielectric layer and a cap dielectric layer sequentially formed thereon;

etching the cap dielectric layer and the Low K inter-dielectric layer sequentially until the barrier layer is exposed and a groove is formed;

removing the cap dielectric layer until the Low K inter-dielectric layer is exposed; and doping a carbon element into the Low K inter-dielectric layer.

Optionally, doping a carbon element into the Low K inter-dielectric layer comprises: doping a carbon element into the Low K inter-dielectric layer after removing the cap dielectric layer.

Optionally, doping a carbon element into the Low K inter-dielectric layer comprises: doping carbon elements into the Low K inter-dielectric layer after forming the Low K inter-dielectric layer and before forming the cap dielectric layer.

Optionally, the Low K inter-dielectric layer is formed by using Diethoxymethylsilane-$C_5H_{14}O_2Si$ (DEMS), and 1-Isopropyl-4-Methyl-1,3-Cyclohexadiene as precursors.

Optionally, forming the Low K inter-dielectric layer comprises a UV-curing on the Low K inter-dielectric layer which is formed by using Diethoxymethylsilane-$C_5H_{14}O_2Si$ (DEMS), and 1-Isopropyl-4-Methyl-1,3-Cyclohexadiene as precursors.

Optionally, the carbon element is doped into the Low K inter-dielectric layer by ion implantation or plasma doping.

Optionally, the carbon element doped into the Low K inter-dielectric layer is carbon ions or a carbon-containing plasma.

Optionally, the carbon-containing plasma comprises $C_7H_x$ or $C_{16}H_x$.

Optionally, the carbon element is doped into the Low K inter-dielectric layer by ion implantation, which has an energy ranged from 200 eV to 20 keV, and has a dosage ranged from 1E13 to 1E16 atoms per square centimeter.

Optionally, the method further comprises: removing part of the barrier layer which has a position corresponding to the position of the groove and forming a metal layer which fills the groove.

Compared with conventional techniques, the invention has several advantages. In some embodiments of the present invention, by doping carbon element into the Low K inter-dielectric layer, the loss of carbon ions in the Low K inter-dielectric layer caused by forming metal interconnect structure can be compensated, so that the dielectric constant value of the Low K inter-dielectric layer is decreased and the performance of the semiconductor devices is improved.

DETAILED DESCRIPTION OF THE INVENTION

Known from the description of the prior art, the resistance-capacitance (RC) delay of the existing interconnect structure is large. After studying the above described problem, the inventors discovered that the reasons for the large RC delay of the existing interconnect structure was that during the processes of etching and cleaning the dielectric layer, depositing Cu and planarizing Cu and the dielectric layer, the Low K inter-dielectric layer was damaged. For example, in the processes of planarization, the chemical reaction between the abrasive and the surface of the Low K inter-dielectric layer caused the loss of carbon ions in the Low K inter-dielectric layer, which resulted in an increase of the dielectric constant of the Low K inter-dielectric layer, so that the RC interconnect delay of the semiconductor devices became larger and affected the electrical performance of the semiconductor devices.

Figure 1:
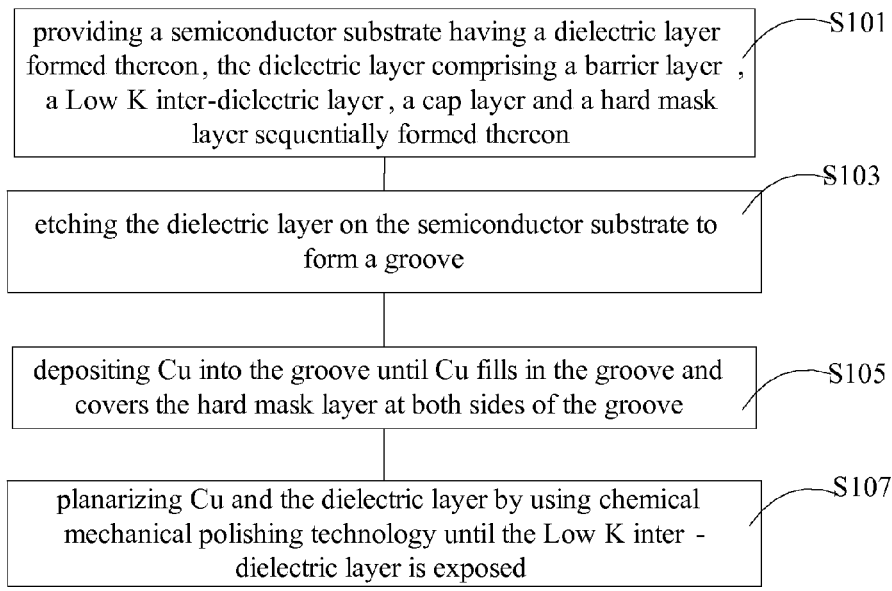
FIG. 1 shows a schematic flow chart of a conventional method for forming an interconnect structure.
Figure 2:
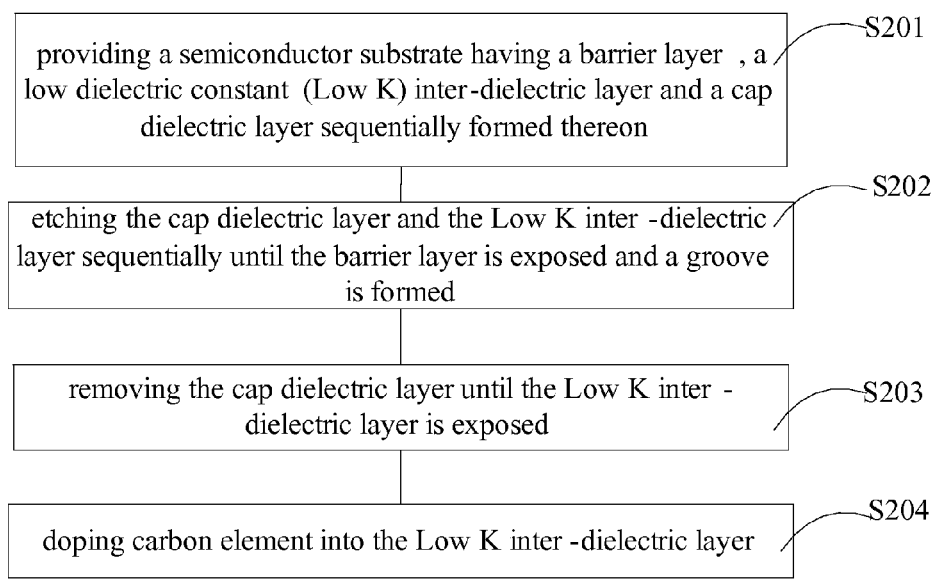
FIG. 2 shows a schematic flow chart of a method for forming an interconnect structure according to an embodiment of the present invention.

After further studying, the inventors developed a method for forming an interconnect structure that reduces the RC interconnect delay. FIG. 2 shows a schematic flow chart of a method for forming an interconnect structure according to an embodiment of the present invention. The method includes:

Step S201, providing a semiconductor substrate having a barrier layer, a Low K inter-dielectric layer and a cap dielectric layer sequentially formed thereon;

Step S202, etching the cap dielectric layer and the Low K inter-dielectric layer in sequence until the barrier layer is exposed and a groove is formed;

Step S203, removing the cap dielectric layer until the Low K inter-dielectric layer is exposed; and Step S204, doping carbon element into the Low K inter-dielectric layer.

The present invention will be described in detail hereinafter with reference to the accompanying drawings, in which preferred embodiments of the invention are shown.

This invention may be implemented in many different forms and should not be construed as limited by the embodiments disclosed herein.

In Step S201, a semiconductor substrate 200 is provided. The semiconductor substrate 200 has a barrier layer 210, a Low K inter-dielectric layer 220 and a cap dielectric layer sequentially formed thereon.

Figure 3:
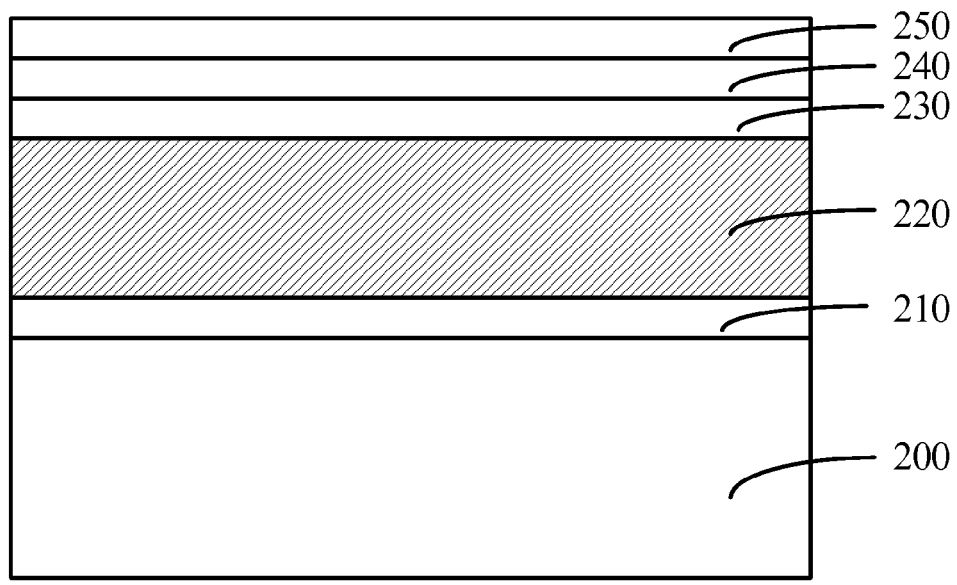
FIG. 3 to FIG. 8 show, in cross-section, process steps for forming an interconnect structure according to an embodiment of the present invention.

As shown in FIG. 3, in an embodiment, the cap dielectric layer may comprise a stop layer 230, a protective layer 240, and a hard mask layer 250.

In an embodiment, the barrier layer 210 may include SiC containing nitrogen to prevent an interlayer diffusion between the semiconductor substrate 200 and the sedimentary materials from occurring. The barrier layer 210 may be formed by conventional chemical vapor deposition (CVD) method or physical vapor deposition (PVD) method. The Low K inter-dielectric layer 220 may be formed by using Diethoxymethylsilane-$C_5H_{14}O_2Si$ (DEMS), and 1-Isopropyl-4-Methyl-1,3-Cyclohexadiene as precursors. In another embodiment of the present invention, after forming the Low K inter-dielectric layer 220, the method further comprises a UV-curing on the Low K inter-dielectric layer 220, which can remove bubbles in the Low K inter-dielectric layer 220 and decrease the dielectric constant of the Low K inter-dielectric layer 220. In the embodiment, the dielectric constant value of the Low K inter-dielectric layer ranges from 2.2 to 2.8, and is used as an insulating layer of metal interconnects in the interconnect structure. The use of a Low K inter-dielectric layer as an insulating layer between metal layers can effectively decrease the capacitance associated with the interconnect layers, and thus reduce the RC delay of an integrated circuit and improve its performance.

The stop layer 230 is made of $SiO_2$, $Si_3N_4$, SiC containing nitrogen, or a combination thereof. The thickness of the stop layer 230 ranges from 10 angstrom to 100 angstrom. The protective layer 240 is made of SiO2, which can get from tetraethylorthosilicate (TEOS) as a Si source. The hard mask layer 250 is made of TiN or TaN.

In Step S202, the cap dielectric layer and the Low K inter-dielectric layer 220 is etched sequentially until the barrier layer 210 is exposed and a groove 300 is formed.

Figure 4:
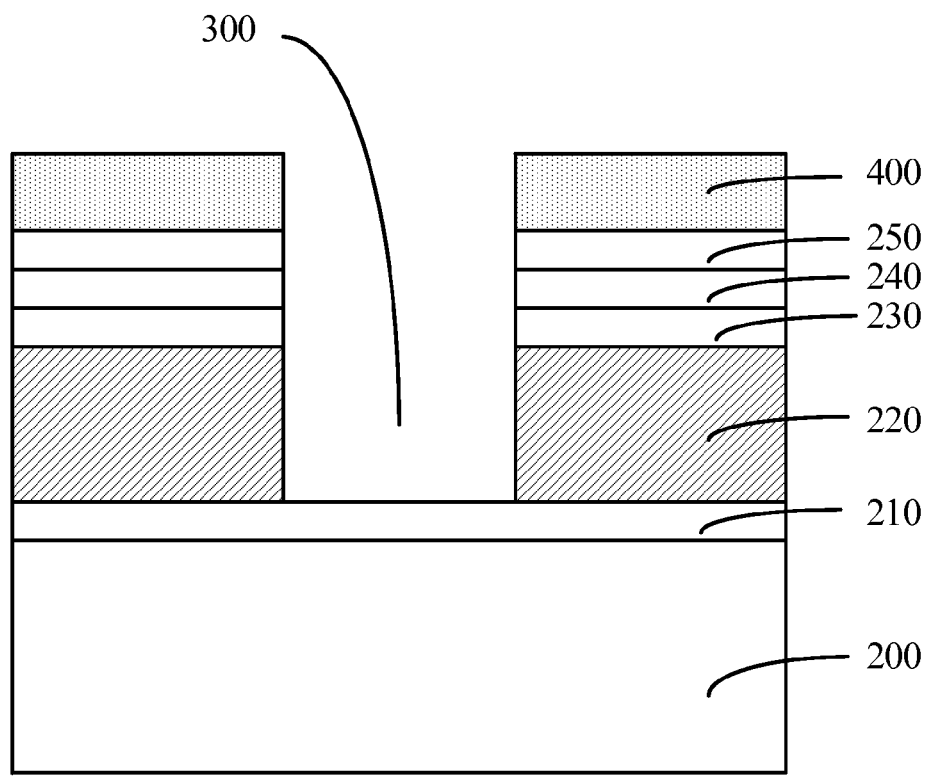
Figure 5:
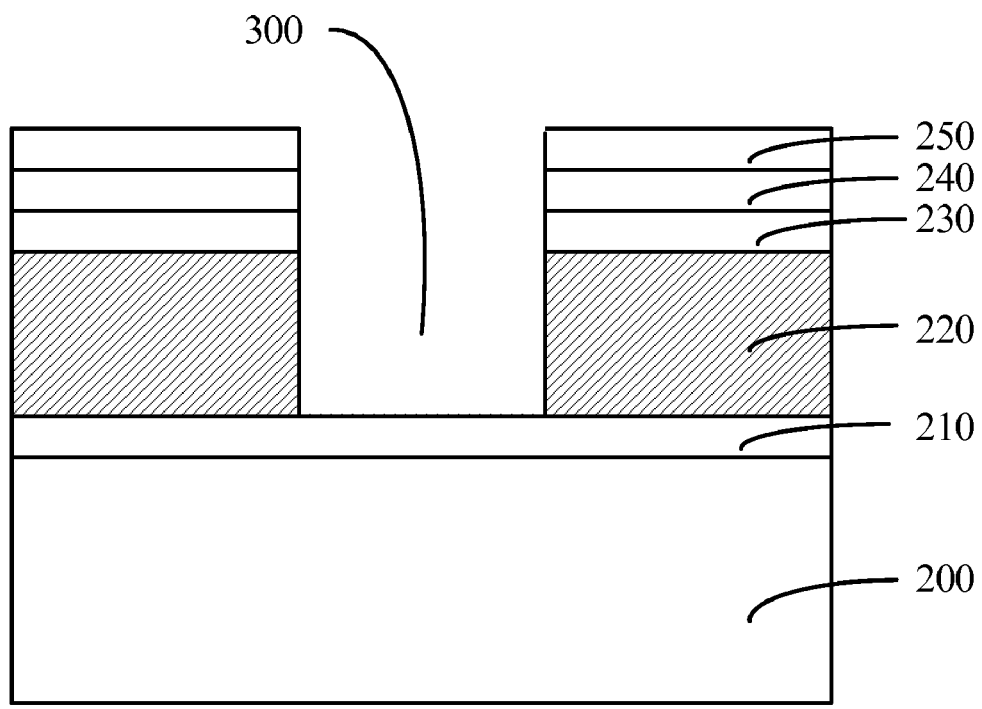

As shown in FIG. 4, in an embodiment, first a photoresist layer 400 with an opening is formed on the hard mask layer 250, which has a position and a width being corresponding to the position and the width of the to-be formed groove 300, and then the hard mask layer 250, the protective layer 240, the stop layer 230 and the Low K inter-dielectric layer 220 are etched sequentially along the opening to form the groove 300. The etching process can be performed by using an existing etching technology. In the embodiment, inductively coupled plasma (ICP) etching device is used, and the etching gas comprises Ar, or a gas containing F, such as $CF_4$, $C_2F_6$, and CHF3, and the like. The elements of the above etching gas are flown into the reaction chamber at the same time, wherein Ar is applied for diluting the etching gas which has a flow rate ranging from 100 sccm to 300 sccm. Among the etching gas, the flow rate of CF4 ranges from 50 sccm to 100 sccm, the flow rate of C2F6 ranges from 100 sccm to 400 sccm, and the flow rate of CHF3 ranges from 10 sccm to 100 sccm. The output power of the radio frequency (RF) power source which ionizes the gas into a plasma ranges from 50 W to 1000 W, and the output power of the RF bias power source ranges from 50 W to 250 W. The pressure set in the reaction chamber ranges from 50 mTorr to 100 mTorr. After forming the groove 300, the photoresist layer 400 is removed by using an ashing process. FIG. 5 shows a cross-sectional view of a completed groove according to the disclosed process flow.

In Step S203, the cap dielectric layer is removed until the Low K inter-dielectric layer 220 is exposed.

Figure 6:
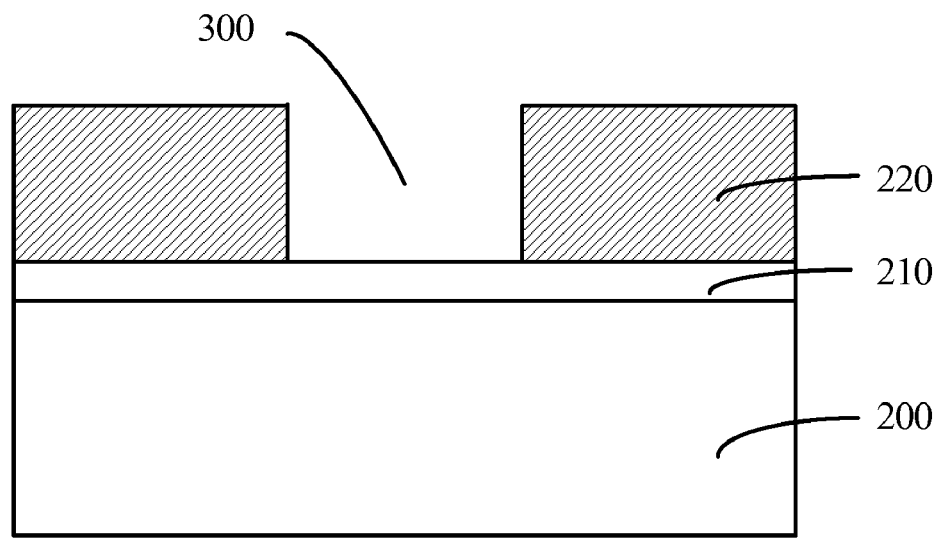

In an embodiment, the cap dielectric layer is removed by a polishing process. As shown in FIG. 6, in an embodiment, a chemical mechanical polishing process is used to polish the hard mask layer 250, the protective layer 240 and the stop layer 230 in sequence until the Low K inter-dielectric layer is exposed. In the polishing process, the chemical composition in the abrasive has chemical reaction with the materials being polished to form relatively loose substance. The substance is detached mechanically from the polishing surface in the relative motion of the substance and the particles in the abrasive. After the polishing process, some solution is used to clean up the surface polished in order to remove the abrasive and the by-product left on the surface polished.

In Step S204, a carbon element is doped into the Low K inter-dielectric layer 220.

Figure 7:
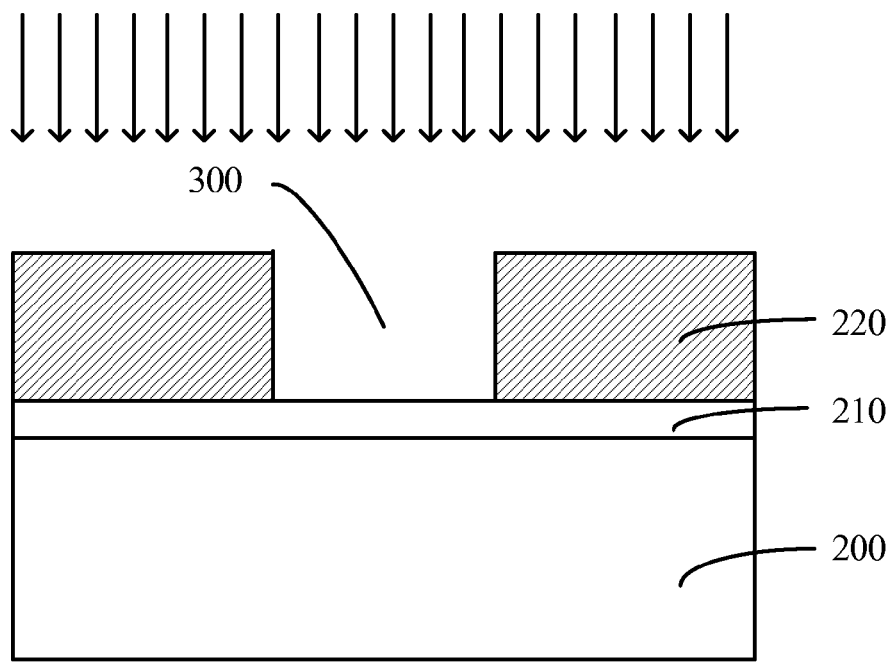

Referring to FIG. 7, the above described etching and chemical mechanical polishing processes, the follow-up PVD process, and the cleaning process after the above processes can cause a loss of carbon ions in the Low K inter-dielectric layer. For example, in an embodiment, a gas containing Fl is used as an etching gas to form the groove 300. In the etching process, the gas containing Fl chemically reacts with a part of the Low K inter-dielectric layer 220 and causes the loss of carbon ions. In the chemical mechanical polishing process, the chemical composition in the abrasive chemically reacts with a part of the Low K inter-dielectric layer 220 and causes the loss of carbon ions in the Low K inter-dielectric layer 220. In the follow-up PVD process to form metal layers, the Ar plasma in the environment will cause the loss of carbon ions in the Low K inter-dielectric layer 220. In the cleaning process, the solution used to clean up may chemically react with a part of the Low K inter-dielectric layer 220 and causes the loss of carbon ions in the Low K inter-dielectric layer 220. The loss of carbon ions increases the dielectric constant which increases the RC delay of a semiconductor device and affects its electronic performances. By doping a carbon element into the Low K inter-dielectric layer 220, the loss of carbon ions can be replaced, so that the increase of the dielectric constant of the Low K inter-dielectric layer caused by the loss of carbon ions can be avoided.

In an embodiment, after removing the cap dielectric layer, carbon is doped into the Low K inter-dielectric layer 220. The method used in this embodiment for doping carbon element into the Low K inter-dielectric layer after the chemical mechanical polishing has insignificant effect on subsequent processes.

In some embodiments of the present invention, a carbon element can be doped into the Low K inter-dielectric layer 220 directly after the Low K inter-dielectric layer 200 is formed. Specifically, after forming the Low K inter-dielectric layer 220, by using ion implantation or plasma doping, a carbon element is doped into the Low K inter-dielectric layer 220, such as C7Hx. Then a cap dielectric layer is formed on the Low K inter-dielectric layer 220 into which carbon element has already been doped. After that, the cap dielectric layer and the Low K inter-dielectric layer are etched until the barrier layer is exposed and the groove is formed.

In an embodiment, the method for doping carbon element into the Low K inter-dielectric layer 220 is ion implantation or plasma doping. A carbon element doped into the Low K inter-dielectric layer 220 is carbon ions or a carbon-containing plasma.

In an embodiment, carbon-based molecules are doped into the Low K inter-dielectric layer 220 by ion implantation. For example, in an embodiment of the present invention, $C_7H_x$ is doped. The ion implantation has an energy ranging from 200 eV to 20 keV, and has a dosage ranging from 1E13 to 1E16 atoms per square centimeter.

In another embodiment of the invention, $C_{16}H_x$ is doped, which has an energy ranging from 200 eV to 20 keV, and has a dosage ranging from 1E13 to 1E16 atoms per square centimeter.

In an embodiment of the invention, in the process of doping carbon element into the Low K inter-dielectric layer 220, the damage on the surface of the Low K inter-dielectric layer 220 caused in the process of chemical mechanical polishing can be repaired, which is beneficial for forming a good interface between the metal layer and the Low K inter-dielectric layer 220 in a subsequent process in which the groove 300 is filled with a metal material.

In doping a carbon element into the Low K inter-dielectric layer 220, because the barrier 210 protects the surface of the semiconductor substrate 200 which has a position corresponding to the position the groove 300, the doping process will not affect the semiconductor substrate 200.

Figure 8:
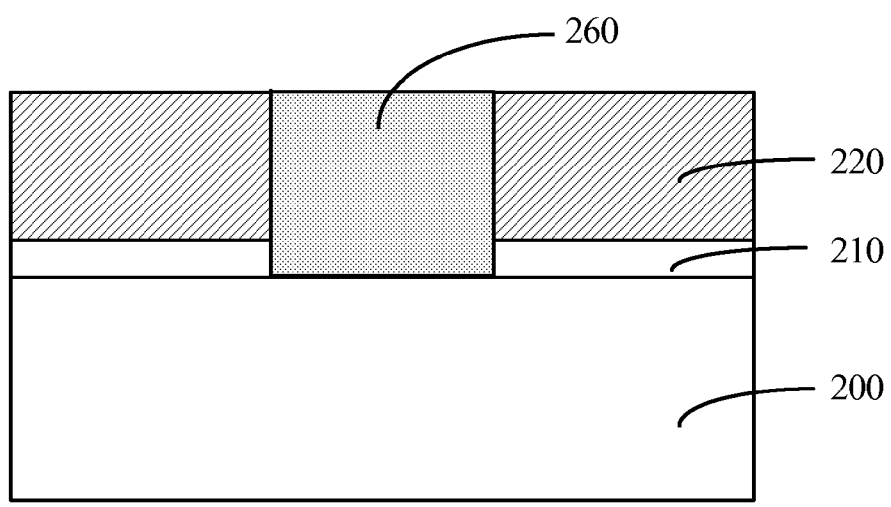

A subsequent process, as shown in FIG. 8, further comprises removing a part of the barrier layer 210 that has a position corresponding to the position of the groove 300, and forming the metal layer 260 which fills the groove 300. In an embodiment, the metal layer 260 is made of Cu. The metal layer 260 forms the interconnect structure.

According to embodiment of the present invention, the loss of carbon ions in the Low K inter-dielectric layer that occurs during the process of forming the metal interconnect structure can be compensated by doping carbon elements into the Low K inter-dielectric layer. Therefore, the dielectric constant of the Low K inter-dielectric layer is decreased and the performance of the semiconductor devices is improved.

Although the present invention has been disclosed with reference to preferred embodiments, it is not intended to limit the present invention. Those skilled in the art may modify and vary the embodiments without departing from the spirit and scope of the present invention. Accordingly, the scope of the present invention shall be defined in the appended claims.

What is claimed is:

1. A method for forming an interconnect structure, the method comprising:
   providing a semiconductor substrate having a barrier layer, a low dielectric constant (Low K) inter-dielectric layer and a cap dielectric layer sequentially formed thereon;
   etching the cap dielectric layer and the Low K inter-dielectric layer sequentially until the barrier layer is exposed and a groove is formed;
   removing the cap dielectric layer until the Low K inter-dielectric layer is exposed; and
   doping a carbon element into the Low K inter-dielectric layer after removing the cap dielectric layer.

2. The method according to claim 1, wherein the Low K inter-dielectric layer is formed by using Diethoxymethylsilane-$C_5H_{14}O_2Si$ (DEMS), and I-Isopropyl-4-Methyl-I,3-Cyclohexadiene as precursors.

3. The method according to claim 2, wherein forming the Low K inter-dielectric layer comprises a UV-curing on the Low K inter-dielectric layer which is formed by using Diethoxymethylsilane-$C_5H_{14}O_2Si$ (DEMS), and I-Isopropyl-4-Methyl-I,3-Cyclohexadiene as precursors.

4. The method according to claim 3, wherein the carbon element is doped into the Low K inter-dielectric layer by ion implantation or plasma doping.

5. The method according to claim 4, wherein the carbon element doped into the Low K inter-dielectric layer is carbon ions or a carbon-containing plasma.

6. The method according to claim 5, wherein the carbon-containing plasma comprises $C_7H_x$ or $C_{16}H_x$.

7. The method according to claim 1, wherein the carbon element is doped into the Low K inter-dielectric layer by ion implantation, which has an energy ranged from 200 eV to 20 keV, and has a dosage ranged from IE13 to IE16 atoms per square centimeter.

8. The method according to claim 1, further comprising: removing part of the barrier layer which has a position corresponding to the position of the groove and forming a metal layer which fills the groove.

* * * * *